(12) United States Patent
Wu et al.

(10) Patent No.: US 6,903,410 B1
(45) Date of Patent: Jun. 7, 2005

(54) ELECTRICALLY ERASABLE PROGRAMMABLE READ ONLY MEMORY CELL AND PROGRAMMING METHOD THEREOF

(75) Inventors: Chao-I Wu, Hsinchu (TW); Ming-Hsiu Lee, Hsinchu (TW)

(73) Assignee: Macronix International Co., Ltd, Hsinchu (TW)

( * ) Notice: Subject to any disclaimer, the term of this patent is extended or adjusted under 35 U.S.C. 154(b) by 0 days.

(21) Appl. No.: 10/710,765

(22) Filed: Aug. 2, 2004

(51) Int. Cl.$^7$ ............................................... H01L 29/792
(52) U.S. Cl. ...................................... 257/324; 257/325
(58) Field of Search ................................ 257/324–325, 257/316–317; 438/216, 261, 591, 593

(56) References Cited

U.S. PATENT DOCUMENTS 6,215,148 B1 * 4/2001 Eitan ........................... 257/316

* cited by examiner

*Primary Examiner*—Thien F Tran
(74) *Attorney, Agent, or Firm*—Jianq Chyun IP office

(57) ABSTRACT

An electrically erasable programmable read only memory cell has a stacking layer, a gate conductive layer, a first source/drain region, a second source/drain region, a first pocket implant doping region, and a second pocket implant doping region. The stacking layer is disposed over a substrate. The gate conductive layer is located on the stacking layer. The first source/drain region and the second source/drain region are respectively disposed over the substrate on two sides of the gate conductive layer. The first pocket implant doping region is disposed over the substrate under the stacking layer, and adjacent to the first source/drain region. The second pocket implant doping region is disposed over the substrate under the stacking layer, and adjacent to the second source/drain region, wherein the doping concentration of the first pocket implant region is different from that of the second pocket implant region.

9 Claims, 5 Drawing Sheets

ELECTRICALLY ERASABLE PROGRAMMABLE READ ONLY MEMORY CELL AND PROGRAMMING METHOD THEREOF

BACKGROUND OF INVENTION

1. Field of Invention

The present invention relates to a memory device and programming method thereof, and more particularly, to and Electrically Erasable and Programmable Read Only Memory (EEPROM) cell and programming method thereof.

2. Description of the Related Art

Electrically Erasable and Programmable Read Only Memory (EEPROM) serves for multiple data write/read/rapid erase operations, and the data stored therein stays after supplying power is off. Therefore, it is a versatile memory device that is broadly used in a personal computer and other electronic appliances.

A silicon nitride ROM is one of the common categories of EEPROM, whose structure is illustrated in FIG. 1. Referring to FIG. 1, the silicon nitride ROM comprises a stacking layer 108, formed by silicon oxide tunneling dielectric layer 102/silicon nitride charge trapping layer 104/silicon oxide tunneling dielectric layer 106 sequentially, disposed on a substrate 100, a gate conductive layer 110 over the stacking layer 108, and source/drain regions 112a and 112b disposed on two sides of the gate conductive layer 110 in the substrate 100. Applying a bias configuration to the source/drain region 112a and the gate conductive layer 110 to program the EEPROM cell, where electronic charges in the substrate 100 are injected to the area 114 of the charge trapping layer 104 adjacent to the source/drain region 112a via Channel Hot Electron Injection (CHEI) effect, and a bit is stored therein.JunO42004JunO42004 Similarly, the above bias configuration can be applied to the source/drain region 112b and the gate conductive layer 110 for another programming operation, such that electronic charges in the substrate 100 are injected to an area 116 of the charge trapping layer 104 adjacent of the source/drain region 112b via CHEI effect, and another bit is stored therein. In other words, with programming operations in different directions, electronic charges are respectively stored on two sides of the charge trapping layer 104, i.e. the silicon nitride EEPROM is a memory cell capable of two bits, namely 2 Bit/Cell.

However, if a bit is already stored in the area 114 or 116, when operating reverse read to the silicon nitride EEPROM cell, i.e. a reading direction is opposite to the programming direction, a $2^{nd}$-bit effect might occur. That is, the stored bit increases the potential barrier. Therefore a threshold voltage $V_t$ of reading operation is increased, and further limiting a sensing window between the threshold voltages of the two bits stored on two sides of the charge trapping layer.

Besides, if operating one-side reading to the silicon nitride EEPROM, then the $V_t$ level of the bit adjacent to the source/drain region 112b in FIG. 1 is affected.

Referring to FIG. 2A, it illustrates a transfer profile of the reading voltage and the threshold voltage level, where the horizontal axis represents reading voltage in volts, whereas the vertical axis represents threshold voltage level in volts. Moreover, the circle and square symbols in FIG. 2A respectively represent transfer profiles between the reading voltage and the threshold voltage for the right hand side and left hand side of the charge trapping layer. According to FIG. 2A, since the source/drain region on the right hand side is biased, a potential barrier of the bit stored on right hand side in the charge trapping layer is negatively affected, i.e. lowered, and thus an effective threshold voltage is lowered. Therefore, the threshold voltage level of the bit stored on right hand side in the charge trapping layer is lower than that of the bit stored on left hand side in the charge trapping layer.

Referring to FIG. 2B, which is similar to FIG. 2A, where a transfer profile between a reading voltage and a threshold voltage level is illustrated. What is different in FIG. 2B from FIG. 2A is an amount of electronic charges stored on two sides of the charge trapping layer, i.e. more electronic charges are stored in FIG. 2B than FIG. 2A. In FIG. 2B, more electrons are stored on two sides of the charge trapping layer, yet the effective threshold voltage is still affected by whether the adjacent source/drain regions are biased with voltage. That is, the bit stored on right hand side of the charge trapping layer is affected by the source/drain region with biased voltage on the right hand side, the effective threshold voltage is still lowered, which cannot be similar to that of the bit stored on left hand side of the charge trapping layer.

SUMMARY OF INVENTION

In the light of the above descriptions, the present invention is directed to an Electrically Erasable and Programmable Read Only Memory (EEPROM) cell, which provides similar threshold voltage levels to the bitsin different charges stored on two sides of a charge trapping layer when performing read operation.

The present invention is also directed to a programming method of an EEPROM, for providing similar effective threshold voltage levels to the bits in different charges stored on two sides of a charge trapping layer when performing read operation.

According to one embodiment of the present invention, an EEPROM cell is provided, wherein the EEPROM cell comprises a stacking layer, a gate conductive layer, a source/drain region, a second source/drain region, a first pocket implant doping region and a second pocket implant doping region. The stacking layer is disposed over a substrate, and the stacking layer comprises a tunneling dielectric layer, a charge trapping layer and a block dielectric layer sequentially. The gate conductive layer is disposed over the stacking layer. The first source/drain region and the second source/drain region are respectively disposed on two sides of the gate conductive layer in the substrate. Moreover, the first pocket implant doping region is disposed below the stacking layer in the substrate being adjacent to the first source/drain region, and the second pocket implant doping region is disposed below the stacking layer in the substrate being adjacent to the second source/drain region, where a doping concentration of the first pocket implant doping region is different from a doping concentration of the second pocket implant doping region.

According to one embodiment of the present invention, a programming method is provided, which is suitable to an EEPROM cell. Wherein the EEPROM cell comprises a substrate, a charge trapping layer, a gate conductive layer, a first source/drain region, a second source/drain region, a first pocket implant doping region and a second pocket implant doping region, wherein a dopant concentration of the first pocket implant doping region is higher than A dopant concentration of the second pocket implant doping region. The programming method comprising applying a bias configuration to the gate conductive layer and the first source/ drain region for performing a first programming, so as to inject electronic charges from the substrate to the charge trapping layer adjacent to the first source/drain region. Moreover, applying the bias configuration to the gate conductive layer and the second source/drain region for performing a second programming, so as to inject electronic charges from the substrate to the charge trapping layer adjacent to the second source/drain region, wherein an amount of electronic charges injected during the first programming is larger than an amount of the electronic charges injected during the second programming.

Since the dopant concentration in the pocket implant doping regions are different, when programming the EEPROM cell, the electronic charges injected to two sides of the charge trapping layer are different, such that the threshold voltage of the bit stored adjacent to the first source/drain region is higher. Therefore, when applying reading voltage to the first source/drain region for reading from the EEPROM, the threshold voltage of the bit stored adjacent to the first source/drain region can be lowered, whereas the threshold voltages of the bits stored on two sides are still similar.

DETAILED DESCRIPTION

Figure 1:
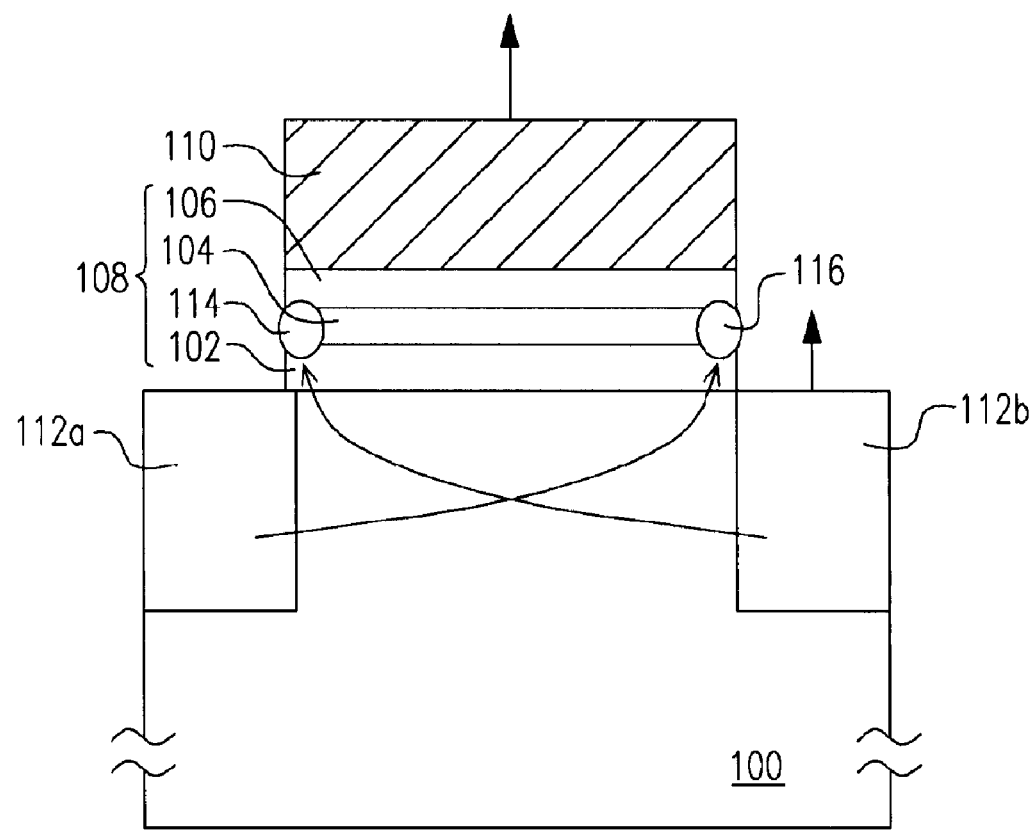
FIG. 1 is a schematic diagram of a cross-sectional view illustrating a conventional silicon nitride ROM cell.
Figure 2A:
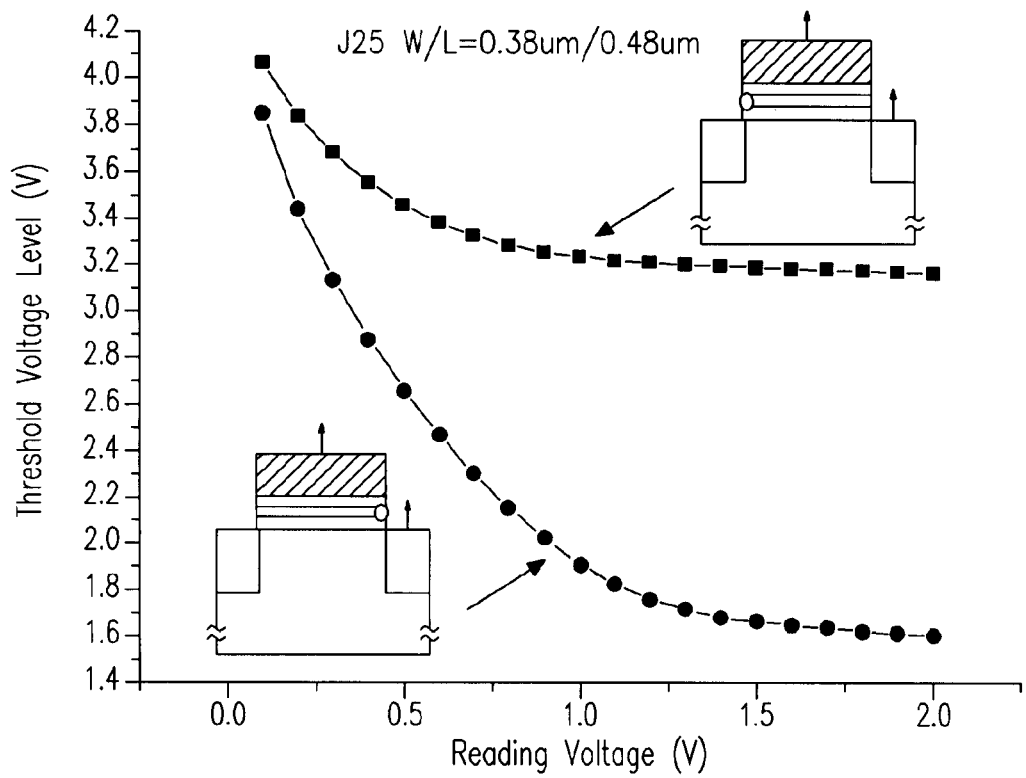
FIGS. 2A and 2B are schematic transfer profile diagrams illustrating reading voltage vs. threshold voltage level of a conventional EEPROM cell.
Figure 2B:
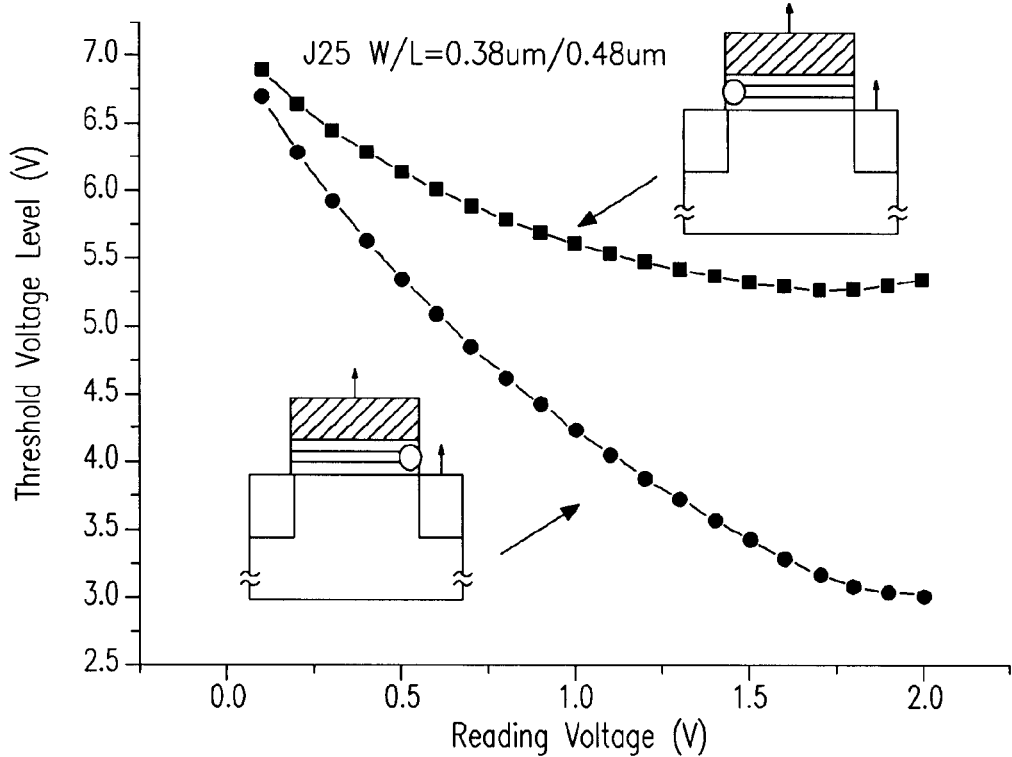
Figure 3:
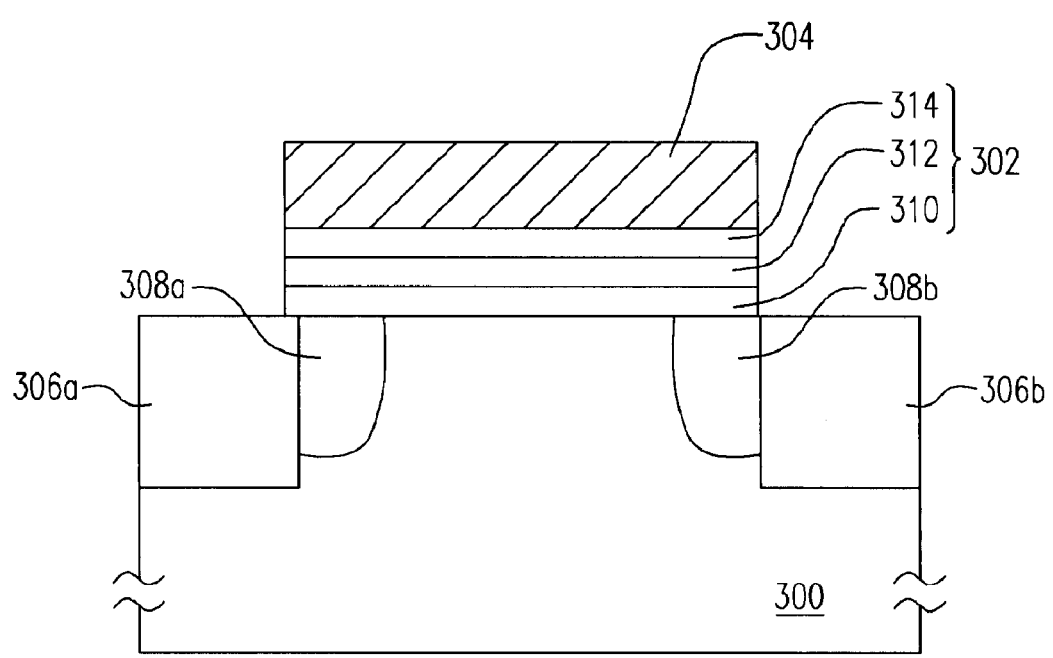
FIG. 3 is a schematic diagram of a cross-sectional view illustrating an EEPROM cell according to one embodiment the present invention.

Referring to FIG. 3, it illustrates a schematic diagram of a cross-sectional view of an Electrically Erasable and Programmable Read Only Memory (EEPROM) cell according to one embodiment the present invention.

In FIG. 3, the EEPROM cell comprises a substrate 300, a stacking layer 302, a gate conductive layer 304, source/drain regions 306a and 306b, pocket implant doing regions 308a and 308b.

Wherein the substrate 300 is exemplary a silicon substrate, which can be a P-type silicon substrate or an N-type silicon substrate. The stacking layer 302 is disposed over the substrate 300, and the stacking layer 302 comprises a tunneling dielectric layer 310, a charge trapping layer 312 and a blocking dielectric layer 314 sequentially. Wherein a material of the tunneling dielectric layer 310 is silicon oxide, for example, or other appropriate dielectric materials. A material of the charge trapping layer 312 is silicon nitride, for example, or other appropriate materials. A material of the blocking dielectric layer 314 is silicon oxide, for example, or other appropriate dielectric materials.

The gate conductive layer 305 is disposed over the stacking layer 302, where a material of the gate conductive layer 304 comprises poly-silicon, doped poly-silicon or other appropriate conductive materials. The source/drain regions 306a and 306b are disposed on two sides of the gate conductive layer 304 in the substrate 300. Wherein a dopant type of the source/drain regions 306a and 306b are N-type or P-type, for example, depending on the dopant type of the substrate.

Moreover, the pocket implant doping region 308a is disposed below the stacking layer 302 in the substrate 300, and is adjacent to the source/drain region 306a. The pocket implant doping region 308b is disposed below the stacking layer 302 in the substrate, and is adjacent to the source/drain region 306b.

It is noted that the doping concentration of the pocket implant doping region 308a is different from (preferably higher than) that of the pocket implant doping region 308b, i.e. an asymmetrical pocket implant region is formed. With this feature, when programming the EEPROM cell, more charges are stored in the part of the charge trapping layer 312 adjacent to the pocket implant doping region 308a, and thus the threshold voltage of the bit stored in the region. Wherein different doping concentrations of the pocket implant doping regions 308a and 308b are rendered by different doses or different implant energy. Moreover, the dopant type of the pocket implant doping regions 308a and 308b is opposite to that of the source/drain regions 306a and 306b, e.g. P-type or N-type dopant, which is subject to the dopant type of the source/drain regions 306a and 306b in an embodiment of the present invention. When applying a voltage to the source/drain regions 306a or 306b, a depletion region is formed in a PN junction between the source/drain region 306a (or 306b) and the pocket implant doping region 308a (or 308b), where electric filed is strengthened, and electronic charges are injected to the charge trapping layer 312 more easily.

Figure 4A:
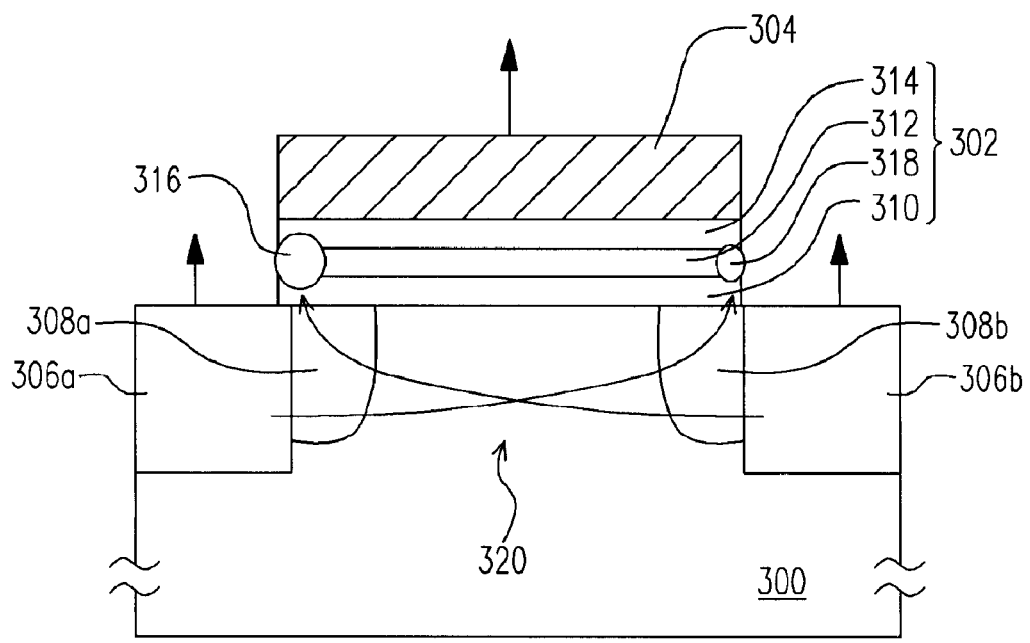
FIGS. 4A to 4D are schematic diagrams of cross-sectional view illustrating an EEPROM cell under programming operation according to one embodiment of the present invention.

The programming method of the EEPROM cell mentioned above is described hereinafter. Referring to FIG. 4A, a programming method of the EEPROM cell comprises performing a first programming step with applying a bias configuration to the gate conductive layer 304 and the source/drain region 306a, where electronic charges in the substrate 300 are injected to an area 316 of the charge trapping layer 312 adjacent to the source/drain region 306a via channel hot electron injection (CHEI) effect. To be more precise, a voltage level applied to the conductive layer 304 serves to turn on the channel region 320 between the source/drain regions 306a and 306b. When a bias potential between the source/drain regions 306a and 306b is substantially high, excess hot electrons are generated in the channel region 320 and part of which are injected through the tunneling dielectric layer 310 to the area 316 of the charge trapping layer 312 via the edge, and storing a bit therein. In an embodiment of the present invention, the bias configuration includes applying 10 volts to the conductive layer 304, and applying 5 volts to the source/drain region 306a, for example.

Figure 4B:
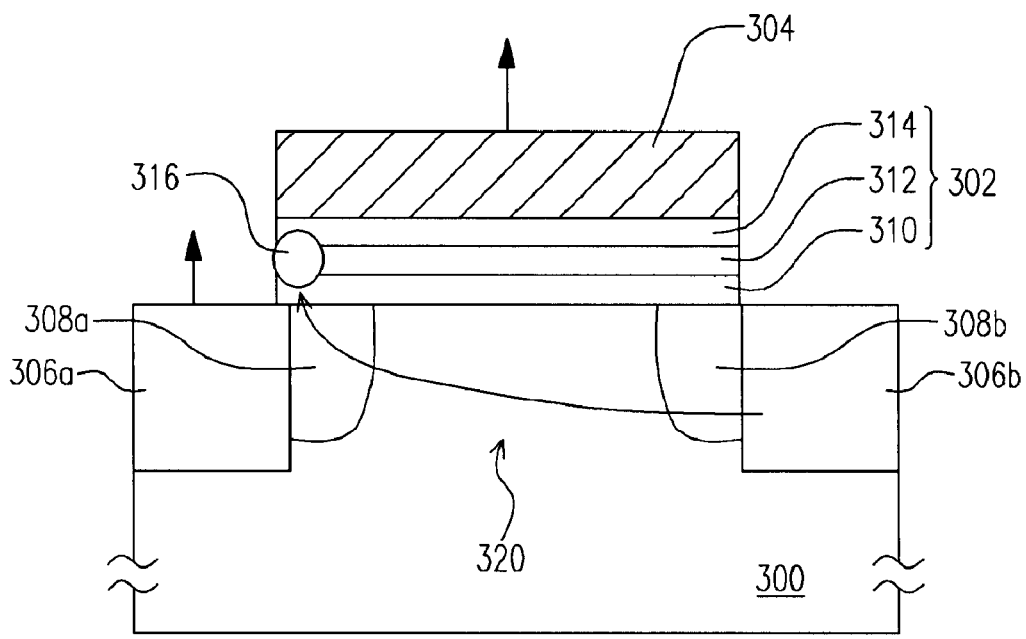
Figure 4C:
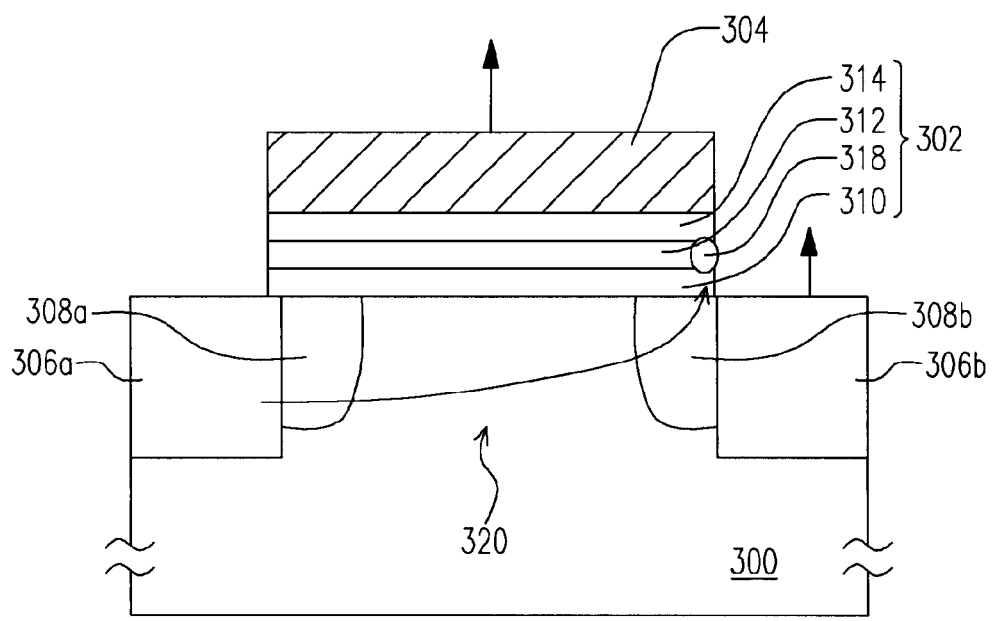
Figure 4D:
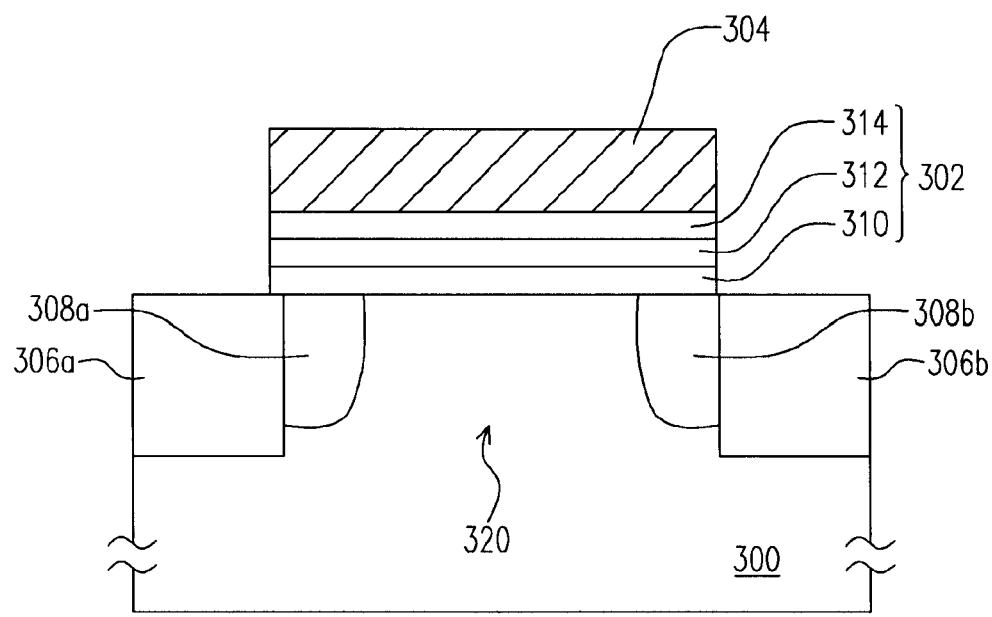

Thereinafter, operating temptempa second programming step, i.e. applying a same bias configuration of the conductive layer 304 and the source/drain region 306b, where electronic charges injected from the substrate 300 to an area 318 of the charge trapping layer 312 adjacent to the source/drain region 306b via channel hot electron injection (CHEI) effect, and stored as another bit therein. The foregoing programming steps are not arrange in a specific order, i.e. a bit can be stored in the are 318 then another bit is stored in the are 316. Besides, electronic charges are stored in merely one of the areas 316 and 318 of the EEPROM cell according to an embodiment of the present invention (shown in FIGS. 4B and 4C), or stored in neither of the areas 316 nor 318 (shown in FIG. 4D), and thus a 2-bit, 4-level memory cell is formed.

It is noted that a dopant concentration of the pocket implant doping region 308a is higher than that of the pocket implant doping region 308b, thus an asymmetrical pocket implant doping region is formed. Therefore, an amount of electronic charges stored in the region 316 is higher than that stored in the region 318, i.e. a threshold voltage of the region 316 is higher. Therefore, when applying a voltage to the source/drain region 306a for reading the EEPROM cell, although an effective threshold voltage level of the region 316 can be lowered, the threshold voltage of the region 316 is still raised via the higher dopant concentration of the pocket implant doping region 308a. Hence, when reading from the source drain region 306a, the effective threshold voltage that is already lowered in the region 316 is similar to that of the region 318.

Moreover, as opposed to increasing programming voltage or increasing programming time for raising threshold voltage of the region 316, a same bias configuration is operated while different electronic charges are stored. Therefore, the programming method of the present invention is easier, and programming that is needed is shorter, as well as programming efficiency is improved.

Although the invention has been described with reference to a particular embodiment thereof, it will be apparent to those skilled in the art that modifications to the described embodiment may be made without departing from the spirit of the invention. Accordingly, the scope of the invention will be defined by the attached claims and not by the above detailed description.

What is claimed is:

1. An electrically erasable and programmable read only memory (EEPROM) cell, comprising:

a stacking layer disposed over a substrate, wherein the stacking layer comprises a tunneling dielectric layer, a charge trapping layer and a block dielectric layer sequentially;

a gate conductive layer, disposed over the stacking layer;

a first source/drain region and a second source/drain region, respectively disposed on two sides of the gate conductive layer in the substrate;

a first pocket implant doping region, disposed below the stacking layer in the substrate being adjacent to the first source/drain region; and a second pocket implant doping region, disposed below the stacking layer in the substrate being adjacent to the second source/drain region, and a doping concentration of the first pocket implant doping region is different from a doping concentration of the second pocket implant doping region.

2. The EEPROM cell as recited in claim 1, wherein a material of the tunneling dielectric layer comprises silicon oxide.

3. The EEPROM cell as recited in claim 1, wherein a material of the charge trapping layer comprises silicon nitride.

4. The EEPROM cell as recited in claim 1, wherein a material of the blocking dielectric layer comprises silicon oxide.

5. The EEPROM cell as recited in claim 1, wherein a dopant type of the first pocket implant doping region and the second pocket implant doping region is opposite to a dopant type of the first source/drain region and a second source/drain region.

6. The EEPROM cell as recited in claim 5, wherein the dopant type of the first pocket implant doping region is P-type.

7. The EEPROM cell as recited in claim 5, wherein the dopant type of the second pocket implant doping region is P-type.

8. The EEPROM cell as recited in claim 5, wherein the dopant type of the first source/drain region is N-type.

9. The EEPROM cell as recited in claim 5, wherein the dopant type of the second source/drain region is N-type.

* * * * *